(12) United States Patent
Stanley

(10) Patent No.: US 8,194,424 B2
(45) Date of Patent: Jun. 5, 2012

(54) AUTOMATIC ZERO VOLTAGE SWITCHING MODE CONTROLLER

(75) Inventor: Gerald R. Stanley, Osceola, IN (US)

(73) Assignee: Harman International Industries, Incorporated, Northridge, CA (US)

( * ) Notice: Subject to any disclaimer, the term of this patent is extended or adjusted under 35 U.S.C. 154(b) by 917 days.

(21) Appl. No.: 12/116,794

(22) Filed: May 7, 2008

(65) Prior Publication Data
US 2008/0278984 A1 Nov. 13, 2008

Related U.S. Application Data

(60) Provisional application No. 60/928,051, filed on May 7, 2007.

(51) Int. Cl.
*H02M 3/335* (2006.01)
*G05F 1/40* (2006.01)
(52) U.S. Cl. ............... 363/21.17; 363/21.03; 363/21.14; 363/21.18; 323/235
(58) Field of Classification Search .................. 219/715; 363/16–17, 40–41, 95, 97–98, 131–134, 363/21.03, 21.06, 21.09, 21.1, 21.11, 21.14, 363/21.17, 21.18; 323/283, 235; 327/366; 315/111.15; 330/10, 298
See application file for complete search history.

(56) References Cited

U.S. PATENT DOCUMENTS

| | | | | |
|---|---|---|---|---|
| 5,160,896 A | | 11/1992 | McCorkle | 330/251 |
| 5,986,895 A | * | 11/1999 | Stewart et al. | 363/16 |
| 6,172,550 B1 | * | 1/2001 | Gold et al. | 327/366 |
| 6,294,954 B1 | | 9/2001 | Melanson | 330/10 |
| 6,304,137 B1 | | 10/2001 | Pullen et al. | 330/10 |
| 6,362,683 B1 | | 3/2002 | Miao et al. | 330/10 |
| 6,556,053 B2 | * | 4/2003 | Stanley | 327/108 |
| 6,614,208 B2 | * | 9/2003 | Narita | 323/283 |
| 6,631,082 B2 | * | 10/2003 | Birumachi | 363/97 |
| 6,683,494 B2 | * | 1/2004 | Stanley | 330/10 |
| 7,023,268 B1 | | 4/2006 | Taylor et al. | 330/10 |
| 7,034,609 B2 | * | 4/2006 | Risbo et al. | 330/10 |

(Continued)

FOREIGN PATENT DOCUMENTS

JP 2001-258269 9/2001

(Continued)

OTHER PUBLICATIONS

Lau, W.H., Chung, H.S.H., Wu, C.M., Poon, F.N.K., "Realization of Digital Audio Amplifier Using Zero-Voltage-Switched PWM Power Converter," IEEE Transactions on Circuits and Systems Part I: Regular Papers, IEEE Service Center, New York NY, US vol. 47, No. 3, Mar. 1, 2000, XP011012059, ISSN: 1057-7122.

(Continued)

*Primary Examiner* — Adolf Berhane
*Assistant Examiner* — Gary Nash
(74) *Attorney, Agent, or Firm* — Brinks Hofer Gilson & Lione

(57) ABSTRACT

A switching DC to AC power converter includes an automatic zero voltage switching (ZVS) mode controller. The automatic zero voltage switching mode controller may adjust a ZVS dead-time in accordance with a range of load currents being supplied by the power converter that range from quiescent conditions to a predetermined loading level of the power converter. The variable ZVS dead-time may be larger nearer to quiescent conditions, and become progressively smaller as load currents increase. Outside a predetermined range of load currents, the variable ZVS dead-time may be disabled or minimized.

17 Claims, 5 Drawing Sheets

U.S. PATENT DOCUMENTS

| | | | |
|---|---|---|---|
| 7,190,596 B2 | 3/2007 | Durbaum et al. | 363/16 |
| 7,205,821 B2 | 4/2007 | Rutter | 327/427 |
| 7,282,682 B2 * | 10/2007 | Suenaga et al. | 219/715 |
| 7,518,836 B2 * | 4/2009 | Kim et al. | 361/18 |
| 7,554,409 B1 * | 6/2009 | Zhang et al. | 330/298 |
| 7,570,118 B1 * | 8/2009 | Gaboriau et al. | 330/298 |
| 2001/0036085 A1 | 11/2001 | Narita | 363/16 |
| 2005/0184716 A1 | 8/2005 | Brown | 323/283 |
| 2006/0007713 A1 * | 1/2006 | Brown | 363/17 |
| 2006/0017388 A1 * | 1/2006 | Stevenson | 315/111.51 |
| 2006/0033453 A1 * | 2/2006 | Cao et al. | 315/291 |
| 2006/0054938 A1 | 3/2006 | Honda et al. | 257/232 |
| 2006/0220735 A1 | 10/2006 | Honda et al. | 330/10 |

FOREIGN PATENT DOCUMENTS

| | | |
|---|---|---|
| JP | 2007-110845 | 4/2007 |

OTHER PUBLICATIONS

International Search Report issued in PCT/US2008/062909, mailed Sep. 5, 2008.

European Patent Application No. 08 755 123.0-2215, Examination Report dated Nov. 29, 2010 (3 pgs.).

Japanese Office Action, JP 2009-529437, mailed Oct. 31, 2011, 5 pgs.

Class D Audio Amplifiers: Theory and Design, Revision A, Jun. 2005, Sergio Sanchez Moreno, coldamp engineer. (14 pgs.).

International Rectifier, MOSFET Failure Modes in the Zero-Voltage-Switched Full-Bridge Switching Mode Power Supply Applications, Alexander Fiel and Thomas Wu, Applications Department, El Segundo, CA 90245. (6 pgs.).

* cited by examiner

AUTOMATIC ZERO VOLTAGE SWITCHING MODE CONTROLLER

PRIORITY CLAIM

This application claims the benefit of priority from U.S. Provisional Application No. 60/928,051, filed May 7, 2007, which is incorporated by reference.

BACKGROUND OF THE INVENTION

1. Technical Field

The invention relates to zero voltage switching in power converters used in power conversion applications.

2. Related Art

A class D power converter may be used in switch-mode audio amplifiers. Class D signal amplifiers have been popular is recent years in audio applications due to advantages over legacy amplifiers. Less efficient amplifiers include Class A, Class B, Class AB, and Class H.

Class A amplifiers replicate and amplify the entire input signal, and therefore, are very linear. Consequently, they are typically inefficient. Even the most efficient theoretical Class A amplifier can operate at only about 50% efficiency. In general, for every watt of power output capability by a Class A amplifier, another watt is wasted as heat. Actual efficiency rates in Class A amplifiers are less than 10%.

Class B amplifiers in a piecewise linear manner replicate and amplify only half of the input signal. One of two amplifying elements is switched off alternately for every other half cycle. The most efficient theoretical Class B amplifier could operate at 78.5% efficiency. Actual efficiency rates with music are less than 30%. The Class AB amplifier balances the direct tradeoff between the higher efficiency of Class B amplifiers with the linearity of Class A amplifiers.

Class H amplifiers are similar to class A or AB amplifiers but have power supplies that switch between supply voltages to increase the output stage efficiency. The downside of these designs is complexity and the risk that power supply switching transients will not be fully removed from the output signal. Efficiencies can approach 50% with music.

Class D amplifiers are generally described as switching amplifiers because all of the power switching devices are either fully on or fully off. Class D amplifiers may use pulse width modulation (PWM) or another form of modulation. Because the input signal to a Class D amplifier is converted into a pulse train, power is not wasted as in other classes of amplifiers that amplify a signal in linear fashion. In addition to greater relative efficiency, relatively lower heat losses may result in use of relatively smaller heat sinks. The theoretical efficiency rate of Class D amplifiers is 100%. Actual efficiency rates of Class D amplifiers may approach 95%.

Class-D half-bridge power converters used in switch-mode audio amplifiers, as well as other DC to AC power conversion applications may achieve higher efficiencies and lower electromagnetic interferences (EMI) by operating in a zero voltage switching (ZVS) mode of operation. With ZVS mode, during operation, switch devices in a switching stage of the power converter are activated at zero crossings of their main terminal voltage to minimize turn on losses. An amount of time is required by the switch devices to turn off and on. The overlap between these transitions can be referred to as dead-time. A minimum amount of dead-time is needed to avoid having both switch devices closed at the same time. If both switch devices are closed at the same time, potentially destructive shoot-through current that travels directly from supply rail to rail may result. Too much dead-time may result in distortion in the output signal.

SUMMARY

A DC to AC power converter or amplifier, such as an audio amplifier may include a pulse width modulator to produce a pulse width modulation signal, an automatic zero voltage switching mode controller to automatically adjust a ZVS dead-time, an output switching stage to generate an amplifier output signal, and an output filter to filter the output signal. The converter may receive an input signal and supply an amplified output signal to a load. The power converter can be a full-bridge converter or a half bridge converter.

The power converter may be constructed at least partially as an integrated circuit. The converter may operate with a dynamically variable ZVS dead-time to insert a large ZVS dead-time into the pulse width modulation signal at quiescent signal conditions. The inserted ZVS dead-time may automatically become progressively smaller as signal conditions that are larger than quiescent signal conditions arise. The automatic zero voltage switching mode controller may dynamically adjust the ZVS dead-time based on a measured parameter signal indicative of load currents of the converter. In one example, the variable ZVS dead-time may be disabled by the automatic zero voltage switching mode controller when the load currents exceed a predetermined range. In another example, the variable ZVS dead-time may be continue to be minimized as the load currents increase until over ridden by a temperature compensating timer with a fixed ZVS dead-time.

As a result of the automatic control of the ZVS dead-time, efficiency is maximized during quiescent conditions. Thus, in a large amplifier, such as an amplifier with a two channel switching stage formed on an IC capable of operation at up to 125 or 150 watts per channel, heat generated by the output switching stage is minimized during quiescent conditions. As such, the individual output stage switches may be placed on an integrated circuit (IC) in relatively close proximity with relatively small, or negligible heat sinking. In addition, since the ZVS dead-time is disabled or minimized at operating conditions in which load currents are outside a predetermined range, linearity of operation of the amplifier is optimized.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention may be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

Figure 1:
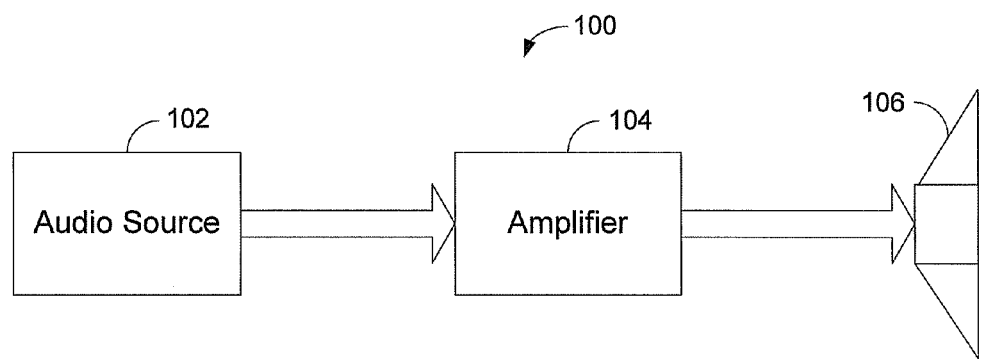
FIG. 1 is a block diagram of an example audio system.

FIG. 1 is a block diagram of an example audio system 100 that includes an audio source 102, an audio amplifier 104, and a load 106. Audio source 102 may provide an input audio signal to the audio amplifier 104. The audio amplifier 104 may operate as DC to AC power converter to amplify the input audio signal using DC supply voltages. In other examples, the audio source 102 may be any other source providing an input signal to be amplified, and the audio amplifier 104 may be a power amplifier or any other form of DC to AC power converter capable of amplifying an input signal. The audio amplifier 104 may produce an amplified modulating output signal that is provided to the load 106. The load 106 may be one or more loudspeakers, or any other device capable of receiving an amplified output signal.

Figure 2:
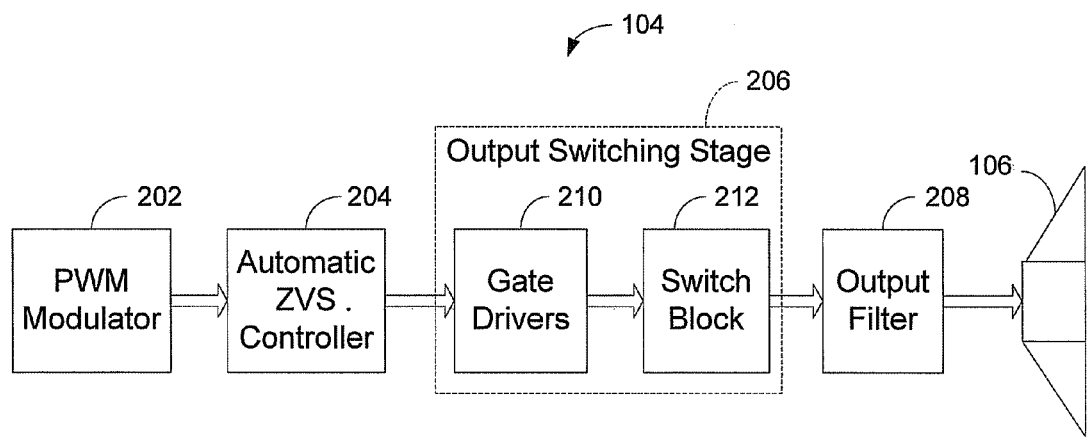
FIG. 2 is a block diagram of an example of the amplifier of FIG. 1.

FIG. 2 is a block diagram of an example audio amplifier 104 and the load 106. The audio amplifier 104 includes a pulse width modulation (PWM) modulator 202, an automatic zero voltage switching (ZVS) mode controller 204, an output switching stage 206, and an output filter 208. The PWM modulator 202 may be any circuit or device capable of producing switching control signals based on a variable continuous input signal. In one example, the PWM modulator 202 may digitally modulate the input signals onto a triangle waveform with pulse width modulation (PWM) to form the switching control signals. The switching control signals may be provided to the automatic ZVS mode controller 204.

The automatic ZVS mode controller 204 may be any device or circuit capable of performing logic. In one example, the automatic ZVS mode controller 204 may be a logic circuit of discrete components and/or implemented in an integrated circuit (IC), configured to perform the functionality described. In another example, the automatic ZVS mode controller 204 may be a processor executing instructions stored in a memory to perform the functionality described, where the memory may be any form of storage device capable of storing instructions in the form of computer code and/or data to provide the described functionality. In another example, the automatic ZVS mode controller 204 may include both a logic circuit, and a processor having memory. The automatic ZVS mode controller 204 may selectively adjust the timing of the switching control signals to provide automatic zero voltage switching (ZVS) by controlling a zero voltage switching dead-time of output stage switches included in the output switching stage 206.

The output switching stage 206 may include gate drivers 210 and a switch block 212. The gate drivers 210 may control output stage switches included in the switch block 212 based on the switching control signals provided with the PWM modulator 202, as selectively automatically adjusted with the automatic ZVS mode controller 204. The turn-on rates of the output stage switches may be controlled with the gate drivers 210 using switch drive methods that regulate both dV/dt and dI/dt of a turn-on event. Turn-off may also be maximally fast. In one example, audio amplifier 104 may be implemented in a power integrated circuit (IC). The power IC of this example has an inherent advantage over discrete designs when it comes to turn-off rates since switch common lead inductance (MOSFET source inductance), which bounds turn-off rate is largely non-existent. The reduction of the source lead inductance may also maximize stability of a dV/dt (dVds/dt) voltage feedback control of turn-on rate.

The output stage switches included in the switch block 212 may be controlled with the switching control signals to generate an alternating current output signal. In one example, the output stage switches may be metal oxide semiconductor field effect transistors (MOSFETs). In other examples, any other type of transistor or other switching device may be used as the output stage switches. The alternating current output signal may be generated from a positive rail supply voltage (+Vcc) and a negative supply rail (−Vcc) to replicate the audio input signal at increased magnitude.

The output filter 208 may include demodulation filters to minimize pulse width modulation spectra from the output signal such that the waveform of an AC output voltage (Vout) of the output signal is substantially free of visible ripple voltage. The output filter 208 may include a capacitor and an inductor formed to be any type of inductor capacitor (LC) low pass filter.

During operation, the PWM modulator 202 may generate a pulse width modulation (PWM) signal by comparing the input audio signal from audio source 102 (FIG. 1) with a triangle waveform. The automatic ZVS mode controller 204 may operate to selectively implement automatic ZVS control based on a measured parameter indicative of a predetermined range of alternating current flow of the output signal to the load 106. Based on the PWM signal, and the measured parameter, the automatic ZVS mode controller 204 may selectively impose timing on the switching control signals to provide dynamically modulated zero voltage switching control of the gate drivers 210. The gate drivers 210 may control the switch block 212. The output filter 208 may remove the switching frequencies from the output signal generated by the output stage switches included in the switch block 212.

To effect a low-loss mode of switching, the automatic ZVS mode controller 204 may selectively impose a sufficient ZVS dead-time between switch break-before-make cycles to allow a complete collapse of a main terminal voltage for the next-to-be-on output stage switch. When an output stage switch activates with zero main terminal voltage (zero loss), it is operating in the ZVS mode of operation. Not only does the ZVS mode maximize efficiency, the ZVS mode may also minimize electro magnetic interference (EMI) noise.

A ZVS dead-time interval that can be selectively implemented by the automatic ZVS mode controller 204 results in the transfer of energy and associated circulating current from the inductor included in the output filter 208 to the switching node capacitance included in the output filter 208. In one example, the inductor and capacitor included in the output filter 208 are low loss devices. The larger the circulating current, the less dead-time is needed to slew a switching node from one supply potential to the other. For the switching cycle to be of minimum loss the output stage switch that is turning off is configured to turn off rapidly and completely. The longer the output stage switch that is turning off remains on, the more switching losses increase, and the time to effect the transition to zero volts on the next-to-be-on output stage switch is prolonged.

The automatic ZVS mode controller 204 may automatically vary ZVS dead-time to maximize efficiency of operation. Adjustment of the ZVS dead-time with the automatic ZVS mode controller may involve automatically increasing the ZVS dead-time towards a maximum amount that still avoids non-linearity when the audio amplifier is under quiescent, or no load conditions. As used herein, the terms "quiescent" or "no load" refer to the conditions under which the audio input signal is substantially a small DC signal such that there are minimal signal induced load currents generated from the output switching stage 206 and supplied through the output filter 208 to the load 106. In addition, modulation of the ZVS dead-time may involve reducing the ZVS dead-time in order to reduce switch losses as the input signal-induced load currents increase. Thus, the ZVS dead-time may be modulated in a predetermined range based on a corresponding predetermined range of current flow to the load 106. The predetermined range of load current may extend from quiescent conditions (e.g. substantially no current flow to the load 106 and maximum ripple current.) to a predetermined magnitude of current flow to the load 106. The predetermined magnitude of current flow can be any level materially greater than a quiescent ripple current. In most cases the upper end of the range will be well above the quiescent ripple current.

The automatic ZVS mode controller 204 may automatically reduce the ZVS dead-time as input signal-induced load currents are added to the inductor current of the output filter 208 since the circulating current available to commute the ZVS cycle may be reduced as the load circulating currents increase. Upon the input signal-induced load currents increasing beyond the predetermined range of load current, the commute current may no longer be present or may be substantially reduced with respect to quiescent conditions for the output stage switches. Thus, at such time the next-to-be-on switch may need to force the node voltage to the next state resulting in reduced main-terminal voltage potential after the next-to-be-on switch dissipates the energy required to commute the switched output node.

There are two principal components of switch losses when the commute current is no longer present or is substantially reduced. The first component is the integral of a charge present on the output stage switch integrated over the switched voltage, which is a second voltage integral of the capacitance of the output stage switch integrated over the switched voltage. The capacitance can be highly non-linear for output stage switches such as a MOSFET.

The second cause of losses when the commute current is no longer present may be the dominant one, and can increase greatly with current and temperature. The output stage switch that is being turned off has a reverse current in its branch of the circuit. When this current flows in reverse through a turned-off output stage switch, such as a MOSFET, the body diode and/or substrate diode may be forward biased and reverse recovered to allow the next-to-be-on output stage switch to commute the node. This reverse-recovery event may require large currents that are sustained with a full supply voltage across the next-to-be-on output stage switch. In some applications it is possible to augment the body diode of an output stage switch, such as a MOSFET, with a better-recovering type of free-wheeling diode, but the losses incurred in recovering even the best recovering diodes is significant.

When the audio amplifier 104 is operating at signal-induced load currents that are outside the predetermined range of load current, the automatic ZVS mode controller 204 may minimize the ZVS dead-time to an optimally small value, or simply disable the ZVS mode of operation. Outside the predetermined range of load current, the audio amplifier 104 operates at relatively high signal-induced load currents, and may no longer be capable of advantageously operating in the ZVS mode. Thus, the added dead-time of the ZVS mode is no longer useful. The longer the ZVS dead-time, the more charge can be accumulated in the free-wheeling diode device, whatever its construction. In the case of the free-wheeling diode being a MOSFET body-diode, the recovery can be labored and potentially hazardous to the device being recovered. Dynamic avalanche may be seen at high rates of recovery that can result in catastrophic failure. A parasitic bipolar junction transistor (BJT) within the MOSFET can be enabled and its lack of safe-operating-area and sufficient breakdown voltage can precede microscopic hot-spot induced failure within the MOSFET. High temperature can aggravate the matter by increasing a stored charge, reducing the base-emitter voltage threshold of turn-on in the BJT, and/or reducing the thermal margins for the hot-spot formation process.

In general, the less time the output stage switch sees in a reverse current flow mode without being turned-on, the less stored charge can be accumulated in a free-wheeling diode of any form. (Minority-carrier mechanisms being the least well behaved.) For example, a MOSFET is just as conductive in its controlled majority-carrier channel during reverse main-terminal operating conditions as it is when the main-terminals are normally biased (forward current). When so enabled it appears as two devices in parallel, a MOSFET and a diode. The lower the resistance of the MOSFET, the more of the current is diverted from flowing through the diode. In some situations the result of having the majority-carrier channel normally biased may be more than a simple current diversion and may sometimes also result in the physical distribution of charge within the MOSFET being more desirable when the majority-carrier current flows are active.

Implementation of the output switching stage 206 as an integrated circuit (IC) may also have issues with free-wheeling currents flowing in buried N-wells and in the substrate. Not only is the body diode function storing charge, but the charge may be in places in the construction of the IC that can interfere with both the function and the reliability of the IC. These additional charge storage sites can also further lower efficiency since they are part of the recovered energy loss of each switching cycle.

In addition, dead-time may be a principal cause of open-loop non-linearity in output switching stage 206, such as class-D output stages, once the load signal current exceeds the ripple current. There is no large error as long as the load signal current remains less than or substantially equal to the quiescent ripple current.

Thus, the automatic ZVS mode controller 204 is configured to automatically manage the ZVS dead-time over a range of ZVS dead-times that are maximum during quiescent conditions. As the signal-induced load currents increase, the automatic ZVS mode controller 204 may correspondingly decrease the ZVS dead-time to minimize reverse current flow and maintain linearity in the output switching stage 206. In addition, when the ZVS dead-time is no longer useful, the automatic ZVS mode controller 204 may be minimized to an optimally small value or simply disabled. Thus, large signal linearity, when the output audio current is outside the predetermined range of the load current is optimized, and losses are minimized within the predetermined range of load current. In addition, reliability is improved by avoiding shoot through current.

Figure 3:
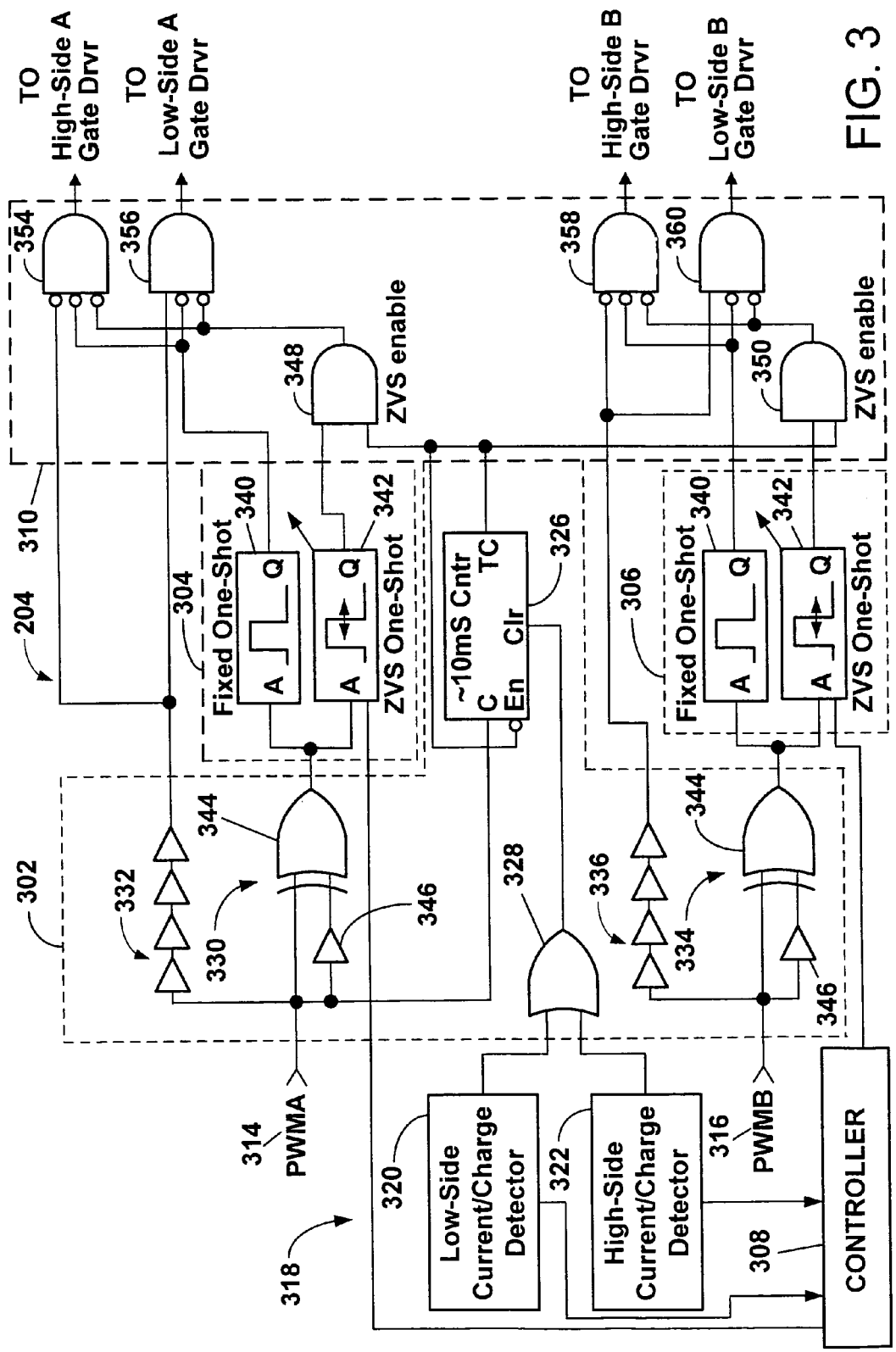
FIG. 3 is a circuit schematic of an example of the automatic zero voltage switching mode controller of FIG. 2.

FIG. 3 is a circuit schematic of an example automatic ZVS mode controller 204 operating as a dead-time controller. The automatic ZVS mode controller 204 includes an input processing circuit 302, a first timer circuit 304, a second timer circuit 306, a controller 308, and a switching control signal output circuit 310. In this example, the output switching stage coupled with the automatic ZVS mode controller 204 is a full bridge output switching stage that includes two half-bridge output stages (A and B) each configured with a high side switch stage and a low side switch stage. In another example, the output switching stage may be a single half bridge output switching stage (A) that includes a high side switch stage and a low side switch stage, and the circuitry associated with the other half-bridge output stage (B) included in FIG. 3 can be omitted. In other examples, the automatic ZVS mode controller 204 may operate as a dead-time controller for two or more paralleled interleaved full-bridge output switching stages.

The two half-bridge output stages (A and B) may operate with interleave with two separate modulation streams (PWMA and PWMB) provided to the respective half-bridge output stages via respective gate drivers from the switching control signal output circuit 310. In FIG. 3, PWMA may be a first pulse width modulation signal, and PWMB may be a separate and independent second pulse width modulation signal that are processed along a first modulation path and second modulation path, respectively. Interleave operation involves the output stage switches in the first or second pulse width modulation signals switching around a common center of time. In another example where interleave is not used, one timer may be used instead of the first timer 304 and the second timer 306. In this example, one of the two half bridges (A or B) may be operated with the PWM data stream, while the other of the half bridges (A or B) is operated with the same PWM data stream, or a complement of the PWM data stream.

In FIG. 3, the input processing circuit 302 may receive a first PWM (PWMA) signal 314 and a second PWM (PWMB) signal 316 from the PWM modulator 202 (FIG. 2). In addition, the input processing circuit 302 may receive a measured parameter signal 318 from one or more sensors or detectors. The measured parameter signal 318 may be one or more signals indicative of one or more respective measured parameters. The one or more measured parameters may be indicative of an alternating current flow from the audio amplifier 104 (FIG. 2) to the load 106 (FIG. 2). Such measured parameters may include elevated output currents, and/or substantial reverse currents, and/or charge in the output stage 204 (FIG. 2).

In FIG. 3, the measured parameters are provided from a low-side current or charge detector 320 and a high-side current or charge detector 322. The measured parameters detected and provided by the high-side current/charge detector 322 and low-side current/charge detector 320 may be sensed from a shared power supply of the audio amplifier 104, sensed from the forward current in a MOSFET in an output stage switch, sensed from the reverse free-wheeling current in a MOSFET, sensed from an output current of the inductive output field, or sensed from any combination thereof. In other examples, the measured parameters may be any other operational parameter of the audio amplifier 104 indicative of a magnitude of alternating current flow being supplied to the load 106. The sampled current may be amplified or attenuated to make analog decisions when the controller 308 operates with comparators. In other examples, a resistance may be used to convert the sampled current to a voltage that is compared to another reference potential voltage upon which control signal outputs can be based.

In one example, it is desirable to sense the currently quickly, however, sensing current with too much speed could also be something to avoid. For example, with MOSFETs, sub 100 nS sensing speeds should be avoided since the normal reverse recovery currents of a MOSFET body diode can be sensed and undesirably reacted to by the automatic ZVS mode controller 204. Circuits or logic within the automatic ZVS mode controller 204 may be used to regulate minimum dead-time values with the intent of avoiding so-called shoot-through currents. However, in some circumstances, shoot-through currents may be necessary to recover free-wheeling diodes at times when it is necessary to engage an opposing output stage switch and the reverse current is of necessity still flowing in at least the free-wheeling diode device and the body-diode.

In one example, forward currents in the output stage switches may be used as the basis for determining not only automatic variation of the ZVS dead-time, but also when ZVS should be disabled. When the forward currents are large in the high-side switches, then the reverse currents are large in the low-side switches and vice versa. Thus, the forward currents may be inferred from the reverse currents, and vice-versa.

Accordingly, reverse current sensing may be directly used by the automatic ZVS mode controller 204 to reveal the need to diminish dead-time. For example, where the output switching stage includes both a high side and a low side, dead-time may be diminished in a half of the output switching stage being sensed. In another example, where an integrator is used to sense charge or current in a location that implies minority-carrier conduction modes, such an integrator can be used as a sensor to provide the measured parameter. From a reliability perspective it may be useful to discern charge storage in the low-side FETs of an IC, such as an NMOS IC. Parasitic bipolar junction transistors (BJTs) that may be formed on the low-side may also be useful charge detectors as long as all currents are limited in scope.

Any of a variety of other measurement techniques may also be used to measure current or charge. Charge measurement is the integral of current with respect to time. In switch-mode power IC's, measurement techniques may be used that require no additional materials other than those materials used in the construction of the IC. Other measurement techniques may require magnetic materials or other materials with desired properties, such as materials with strong Hall coefficients, to measure current or charge.

One measurement technique is a resistive current shunt. A resistive current shunt may be formed by placing a resistance in a source lead of an output stage switch, such as MOSFET, or on a power supply lead to a power stage. The resistive current shunt may provide direct sensing using Ohm's law of the forward current directed from the power supply to the load when the power supply lead is measured, or of a free-wheeling current that returns from the inductance of the output filter 208. Materials for use in resistive current shunt construction for an IC may be highly doped silicon or metallization, such as aluminum or copper used on the interconnections of the IC. A resistive current shunt construction with metallization may offer relatively low losses for high current applications. In addition to a resistive current shunt measurement technique, power MOSFETs allow an opportunity for current sensing using a small number of MOSFET cells as sense FETs. In this measurement technique, a small sampling of the device current may be shared with the main current flow. Either polarity of current flow may be used.

In another measurement technique, charge sensing may be implemented using the charge placed on a junction. A bipolar transistor (BJT) may be used as a charge amplifying device. For example, when the base-emitter junction is placed adjacent to the current flow in the body diode of a MOSFET, the forward conduction charge on the body diode can be sensed and used as an input to the BJT.

Whatever the sensing mechanism, the reduced currents that comprise the quiescent and small signal operation of the output switching stage 206 should not result in the automatic ZVS mode controller 204 detecting and prematurely disabling the ZVS mode of operation. In one example, a boundary for forward current detection may be at about 25% of the peak operating/limiting current of the load. In some examples, the quiescent ripple current may be approximately 10% of the peak load current. In these examples, if the boundary for forward current detection were set to 25%, then there would be no ZVS during all higher load currents yet there would be plenty of current to make a variety of designs whose ripple current tolerance would not prematurely disable ZVS. Thus, circulating current during the quiescent mode may be designed not to exceed a predetermined limit.

The input processing circuit 302 includes a counter 326 and a logic gate 328 that are common to a first gate driver circuit (Gate Drvr—FIG. 2, 210) and a second gate driver circuit (Gate Drvr—FIG. 2, 210). In addition, the input processing circuit 302 includes a first edge detector 330 and a first delay circuit 332 operable with the first gate driver circuit, and a second edge detector 334 and a second delay circuit 336 operable with the second gate driver circuit. In other examples where the audio amplifier 104 includes only a half bridge, the second edge detector 334 and second delay circuit 336 may be omitted.

The controller 308 may be any circuit or device capable of performing logic. In one example, the controller 308 may be a processor or other device capable of executing instructions or code to receive inputs, generate outputs, and perform related processing. The controller 308 of this example may include a memory in which instructions or code are stored and accessed by the processor. In addition, the memory may store data and any other operational parameters related to the operation of the controller 308. In another example, the controller 308 may be a circuit of either discrete components or an integrated circuit capable of performing the functionality described. In another example, the controller 308 may include a processor and a circuit.

In general, the controller 308 may receive a measured parameter signal as a feedback signal in a control loop, and adjust the second timer 342 accordingly. The measured parameter signal sampled by the controller 308 may be amplified or attenuated to enable the controller 308 to, for example, make analog decisions using comparators. In one example, the controller 308 may also include a resistance used to convert the sampled current to a voltage that is compared to another reference potential.

The high-side current/charge detector 322 and the low-side current/charge detector 320 may provide to the controller 308 the measured parameter indicative of signal induced load currents. In addition, the measure parameter is provided via logic gate 328 to the counter 326. For simplicity, and for differential balancing, the automatic ZVS mode controller 204 may disable ZVS mode of all the output stage switches at the same time. For a full-bridge, this implies all four output stage switches use the same mode at the same time. In other examples, the automatic ZVS mode controller 204 may operate some output stage switching sequences with ZVS mode by adding ZVS dead-time and others without ZVS mode.

The counter 326 may be any form of counting device or circuit capable of counting in a range from about 6 milliseconds (mS) to about 18 mS. In other examples, other ranges are possible that are long enough to prevent rapid mode switching on audio frequencies of load current, yet not so long as to compromise overall amplifier operation. In FIG. 3, the counter 326 is a 10 mS digital timer that includes a clear input (Clr), a terminal count output (TC), an enable bar input (EN) and a clock input (C). In FIG. 3, each of the first and second timer circuits 304 and 306 are used with a respective half bridge. In addition, each of the first and second timer circuits 304 and 306 may include a first timer 340 operable at a first time interval, and a second timer 342 operable at a second time interval. The first timer 340 may operate as a fixed one shot timer based on a fixed time interval. The second timer 342, on the other hand, may operate as a ZVS one shot timer with a variable time interval. Each of the first and second timers 340 and 342 may be one-shot flip-flops that provide timing signals to both high and low-side output stage switches. In other examples where the audio amplifier includes only a half bridge, the second timer circuit 306 may be omitted.

The edge detectors 330 and 334 may be any circuit or device capable of sensing a rising or falling edge of a pulse signal. In FIG. 3, the edge detectors 330 and 334 are each formed with logic that includes an XOR gate 344 and a NOT gate 346. The edge detectors 330 and 334 may output a narrow spike on both rising and falling edges of the PWMA and PWMB signals 314 and 316 to trigger outputs of the respective first and second timers 304 and 306. The first and second delay circuits 332 and 336 may include any logic that provides a predetermined signal propagation delay of PWMA and PWMB signals 314 and 316.

In FIG. 3, the signal propagation delay is set to be substantially equal to, or slightly greater than, the propagation delay of the respective first and second edge detectors 330 and 334 and the respective timer circuits 304 and 306. In FIG. 3, the delay circuits 332 and 336 include four inverters. In other examples, any number of inverters, or other delay mechanisms, may be utilized to provide the appropriate propagation delay. When the propagation delay exceeds the delay of the edge detector and timer path, the result is that the on phase of an output stage switch is turned off early rather than allowing the entire effect of dead-time to be the delayed turn-on of an output stage switch. The output signals from the first and second timers 304 and 306 and the delayed PWMA and PWMB signals 314 and 316 may be provided to the switching control signal output circuit 310.

The switching control signal output circuit 310 may be any form of circuit or logic providing gate drive signals to the gate drivers 210 (FIG. 2) that selective include ZVS. In FIG. 3, the switching control signal output circuit 310 includes a first ZVS enable 348 in the first modulation path, and the second ZVS enable 350 in the second modulation path. In addition, the switching control signal output circuit 310 includes a first high side logic 354 and a first low side logic 356 in the first modulation path, and a second high side logic 358 and a second low side logic 360 in the second modulation path. Outputs from the first and second high and low side logics 354, 356, 358 and 360 provide switch control output signals to drive the output switching stage 206 (FIG. 2).

The first timer 340 may be used by the automatic ZVS mode controller 204 to maintain a temperature-compensated minimum ZVS dead-time to prevent gross shoot-through under all operating conditions. The second timer 342 may be adjustable via a timer adjustment signal provided by the controller 308 to provide a variable ZVS dead-time. In one example, where the controller 308 is external to an IC containing the first and second timers 304 and 306, a programming resistor controlled with the controller 308 may be applied to an external pin of the IC to provide automatic adjustment capability of the variable ZVS dead-time of the second timer 342. In other examples, an analog output, a pulse, or any other form of control signal may be provided by the controller 308 to control the variable ZVS dead-time of the second timer 342. The sampled current may be amplified or attenuated to make analog decisions with comparators. A resistance may be used to convert the sampled current to a voltage that is compared to another reference potential.

The first and second high and low side logics 354, 356, 358 and 360 contained in the switching control signal output circuit 310, provide the switch control output signals based on the PWMA and PWMB signals 314 and 316, the output from the counter 326, and the outputs from the timer circuits 304 and 306. Thus, even if the controller 308 were to adjust the second timer 342 to an excessively small value of variable ZVS dead-time, it would have no effect on the actual operating dead-time. Since the first timer 340 may be used as a fixed timer to establish a minimum ZVS dead-time, when the variable ZVS dead-time signal from the second timer 342 is adjusted to provide a ZVS dead-time that is less than the minimum ZVS dead-time provided by the first timer 340, the minimum ZVS dead-time may be logically configured to overrule the variable ZVS dead-time.

During operation with the example of FIG. 3, once a current/charge event outside the predetermined range is detected by either the high-side detector 322 or low-side detector 320, the counter 326 may be cleared (set to zero) based on a signal from logic 328 to the clear input (Clr). The terminal count output (TC) may be substantially simultaneously cleared, disabling the output signal of the second timer 342 using the ZVS enable 348 and 350. Whenever the counter 326 is cleared, the counter 326 zeroes. Once the signal from logic 328 to the clear input (Clr) is no longer present because the event outside the predetermined range has passed, the counter 326 starts counting since the clock input (C) is enabled with the enable bar input (En).

In FIG. 3, the signal provided to the clock input (C) is the PWMA signal 314. In another example, the PWMB signal 316 may be provided as the clock signal input (C). In still other examples, a clock signal other than PWMA or PWMB 314 and 316 may be used. The counter 326 may be clocked on the rising edge of the incoming PWMA signal 314. In another example, the counter 326 may be clocked on the falling edge of the incoming PWMA signal 314. Because of the delay circuit 322, the counter 326 may count to the terminal count (TC) and enable the variable ZVS dead-time from the second timer 342 with the ZVS enable 348 and 350 before the associated rising edge arrives at the low-side logic 358 and 360 positioned downstream. When ZVS is enabled and resumes providing the variable ZVS dead-time or the fixed ZVS dead-time, the operating conditions may be conditions of subdued load currents.

By setting a fairly large time delay between activation of the ZVS suppressing mode with the ZVS enable 348 and 350, and reactivation of ZVS timing, the risk of humanly hearing the mode transition between suppression and reactivation is minimized based on any uncorrected errors in the switching stage outputs. This is because the large signals present that created the mode switch out of ZVS mode may audibly mask the small errors that remain after large feedback corrections have been made to the signal. For example, to count to 10 mS with a 250 KHz PWM signal would require 12 bits of counter with appropriate decoding of the terminal count state (2500). In another example, an 11 bit counter could count to 2047 or 8.188 mS. The loss of counting during clipping of the PWMA signal 314 may be ignored since the percent of time spent clipping should remain relatively small. If, on the other hand, the percentage of clipping is to be large, an alternative count mechanism may be provided during clipping, such as a triangle waveform clock used to form the triangle waveform onto which the input signals are digitally modulated by the PWM modulator 202, or any other clock operable at a multiple of the triangle waveform clock.

In one example, the counter 326 may be cleared following power-up to reset the automatic ZVS mode controller 204. Resetting the automatic ZVS mode controller 204 may be implemented to improve balance or critical startup timing. Alternatively, the counter 326 may enable the ZVS mode at power-up until conditions sensed with the measured parameter signal indicate the signal induced load currents are outside the predetermined range.

In an IC, the automatic ZVS mode controller 204 may be located at the negative rail (−Vcc) or at a substrate level of the IC due to the mutual availability of the gate drive signals and the current/charge information in that vicinity. The gate drive signals may be translated to the negative rail or the substrate level before the gate drive signals are used to either drive the low-side output stage switches, such as FETs, or translated to drive the high side output stage switches, such as NMOS high-side FETs. Translating adjustable timing currents of the timer circuits 304 and 306 from ground level may be more cost effective than having control programming being done at the negative rail (−Vcc) of the amplifier when ground based signal processors are used.

hi another IC example, construction of the automatic ZVS mode controller may be at a ground level in the IC. With the automatic ZVS mode controller 204 implemented at the ground level, the PWM signals may be translated from ground-based logic to the negative rail (−Vcc) of the amplifier. However, in this example, more signals may need to be translated post ZVS dead-time insertion, which may both grow the number of translators and increase the risk that added tolerances or error will creep into the dead-time criticality.

The automatic ZVS mode controller 204 may also be configured to continuously modulate the ZVS dead-time based on the currents seen in the amplifier. Either forward or reverse currents can be sensed as the measure parameter signal, and used as the control variable. For example, either individual switch currents or shared supply currents can be used. In one example amplifier that includes a full-bridge with instantaneous analog supply current information available, a peak catch and hold detector may be used in place of the controller 308 to process the current signals.

Figure 4:
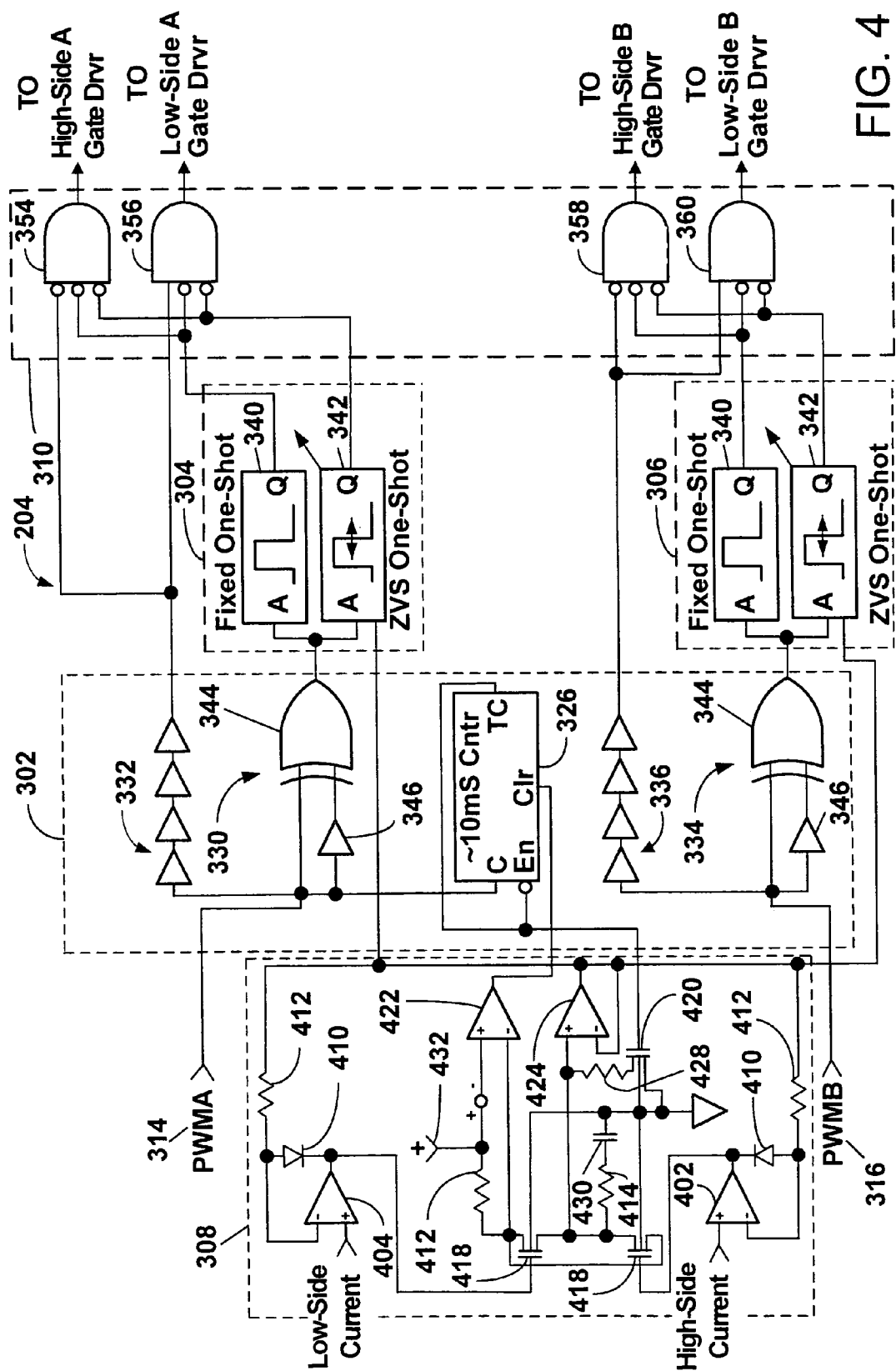
FIG. 4 is a circuit schematic of another example of the automatic zero voltage switching mode controller of FIG. 2

FIG. 4 is a circuit schematic of an example automatic ZVS mode controller 204 that operates as a continuously variable automatic ZVS mode controller to modulate ZVS dead-time. The automatic ZVS mode controller 204 includes the input processing circuit 302, the first timer circuit 304, the second timer circuit 306, the controller 308, and the switching control signal output circuit 310 similar to the automatic ZVS mode controller 204 of FIG. 3. Accordingly, for purposes of brevity, the majority of the following discussion will focus on differences with the previously described automatic ZVS mode controller 204.

In FIG. 4, the controller 308 is configured as a peak catch and hold detector. In this example, rather than disabling the second timer 342 with the ZVS enable 348 and 350 (FIG. 3), as in the previous example, the modulated ZVS dead-time of the second timer 342 is diminished in time such that the modulated ZVS dead-time ultimately vanishes behind the fixed ZVS dead-time provided by the first timer 340 and the ZVS mode operates with minimum dead-time to avoid shoot through.

The example controller 308 in FIG. 4 includes a high side current buffer amplifier 402 and a low side current buffer amplifier 404 configured to receive respective high side current 406 and low side current 408 as the measured parameter signal. When the low side current or high side current exceeds a predetermined peak value, the controller 308 catches and holds the value for a determined period of time. The controller 308 also includes error clamps 410, feedback resistors 412, current resistors 414, measured signal gates 418, a discharge switch 420, a comparator 422, a capacitor buffer amplifier 424, a discharge resistor 428, and a timing capacitor 430. In other examples, other circuit topologies, or a processor may be used to implement similar functionality.

During operation, low side current and high side current are received as the measured parameters. The high side current buffer amplifier 402 and the low side current buffer amplifier 404 charge the timing capacitor 430 via the measured signal gates 418 when the measure parameter is greater than the representative charge current on the timing capacitor 430. The timing capacitor 430 may be cooperatively operable with a timing resistor 414 as an RC circuit. In one example, the timing resistor 414 is sized and placed in series with the timing capacitor 430 to allow the audio amplifier 104 (FIG. 2) to remain stable during charging intervals. The comparator 422 may monitor for charge current to flow to the timing capacitor 430 by comparison of a drain voltage from the measured signal gates 418 to a predetermined offset voltage 432 supplied to the comparator 422. The comparator 422 is triggered when the drain voltage is pulled below the offset voltage 432 to generate a signal at the clear input (Clr) of the counter 326 to initiate a clear of a register storing the count in the counter 326. In other words, the comparator 422 is triggered to reset the counter 326 when the timing capacitor 430 is charged from the measured parameter signal. Thus, whenever the measured parameter signal exceeds the previous peak value indicative of the load current to which the timing capacitor 430 was charged, the counter 326 may reset.

The stored charge on the timing capacitor 430 may be slowly discharged by the discharge switch 420 once the counter 326 counts rising or falling edges of the PWMA signal 314 and terminal count (TC) is reached. Thus, over time, as an alternative to exceeding the peak value indicative of the previously sensed load current, whenever the measured parameter signal exceeds the discharging value of the timing capacitor 430, the counter 326 may similarly be reset. The capacitor buffer amplifier 424 supplies a voltage to the second timer 342 to modulate the ZVS dead-time. Accordingly, the controller 308 operates in a step wise fashion to increase the stored charge on the timing capacitor 430 as the load current increases.

The voltage produced by the capacitor buffer amplifier 424 corresponds to the present load current based on the high side current 406 and low side current 408 being provided as feedback signals, and the charge stored in the timing capacitor 430. Thus, the variable ZVS dead-time of the second timer 342 is variable proportionate to the voltage of the measured parameter.

As such, the second timer 342 is automatically variable such that as the voltage of the measured parameter increases, the dead-time decreases similar to the previous example. During operation, whenever a measured signal indicative of a peak load current is caught and held as a stored charge on the timing capacitor 430, the counter 326 is cleared by a signal from the comparator 422. When the counter 326 is at terminal count (TC), the timing capacitor 430 may be discharged at a predetermined rate by the discharge switch 420 that bleeds the stored charge down to a current tracking level of the measured parameter signal. Each time that the load currents are seen to increase, based on the measured parameter signal, the timing capacitor 430 may be charged to a magnitude that is about equal the new detected current level and the counter 326 may be cleared.

The controller 308 may operate as a peak catch and hold circuit designed to have an attack speed in the low hundreds of nS, which is more than fast enough to meet the needs of this application. Since the inductance of the output filter 208 limits the rate of rise of current in the output switching stage 206, in some examples, the response speeds may be of the micro-second class. The capacitor buffer amplifier 424 may be in the control loop along with the high side current buffer amplifier 402 and the low side current buffer amplifier 404, and the timing capacitor 430. The high side current buffer amplifier 402 and the low side current buffer amplifier 404 are shown with the error clamps 410. The error clamps 410 may be diodes, for example, that minimize the recovery time from what would otherwise be a saturated error condition that would precede each output current peak detection event. In other words, as the high side current 406 and low side current 408 become less than the output of the capacitor buffer amplifier 404, the respective high side current buffer amplifier 402 and the low side current buffer amplifier 404 can maintain control by clamping through the respective error clamps 410 to keep from saturating.

In this example, there may be sufficient gain in the control loop of the peak hold detector to allow the variable dead-time of the second timer 342 to be minimized to less ZVS dead-time than the fixed dead-time of the first timer 340 by such time as current levels of the load are at levels that may be stressful to the audio amplifier 104 (FIG. 2). While different than the automatic ZVS controller 204 described with reference to FIG. 3, the continuously variable system of FIG. 4 may maximize efficiency by allowing insertion of a variable amount of ZVS dead-time to more accurately track the needs of the operating audio amplifier 104 (FIG. 1) as modulation between small and large input signals takes place. In one example, an internal control voltage can be multiplied with a predetermined programmed timing to allow user setting of a time scaling of the ZVS mode for substantially continuously variable ZVS dead-time operation.

Also if the variable ZVS dead-time starts to contract at levels that are not too far above quiescent signal conditions of the audio amplifier 104 (FIG. 2), the linearity of the output power stage can be more ideal over a continuous range of load current levels. In one example, the variable ZVS dead-times may be increased by the automatic ZVS mode controller 204 to be at a maximum dead-time when the peak currents supplied to the load are at less than about 25% of the maximum peak current supplied to the load. The automatic ZVS mode controller 204 may begin to contract or reduce the ZVS dead-time at about 25% of the maximum peak current supplied to the load. The ZVS dead-time may be fully contracted by the automatic ZVS mode controller to a minimum value of ZVS dead-time at about 80% of the maximum peak current supplied to the load. In other examples, the ZVS deadtime may be over any range that enables reliable function within the tolerances of filter components included in the output filter 208 and detector thresholds of the sensor or detector used to obtain the measured parameters.

In FIG. 4, in the example of an IC, the automatic ZVS mode controller 208 may be built at the negative rail (−Vcc), as previously discussed. The automatic ZVS mode controller 208 may be built at the negative rail (−Vcc) due to the ready access to the PWM signals, the high side current 406 and low side current 408. Alternatively, the automatic ZVS mode controller 208 may be built at the substrate, as also previously discussed.

In another example, a hybrid of the system of FIGS. 3 and 4 may be created. In this automatic ZVS mode controller 208, at some predetermined high level of the load current, the automatically modulated ZVS dead-time of the second timer 342 as described with reference to FIG. 4, could be disabled as discussed with reference to FIG. 3.

Figure 5:
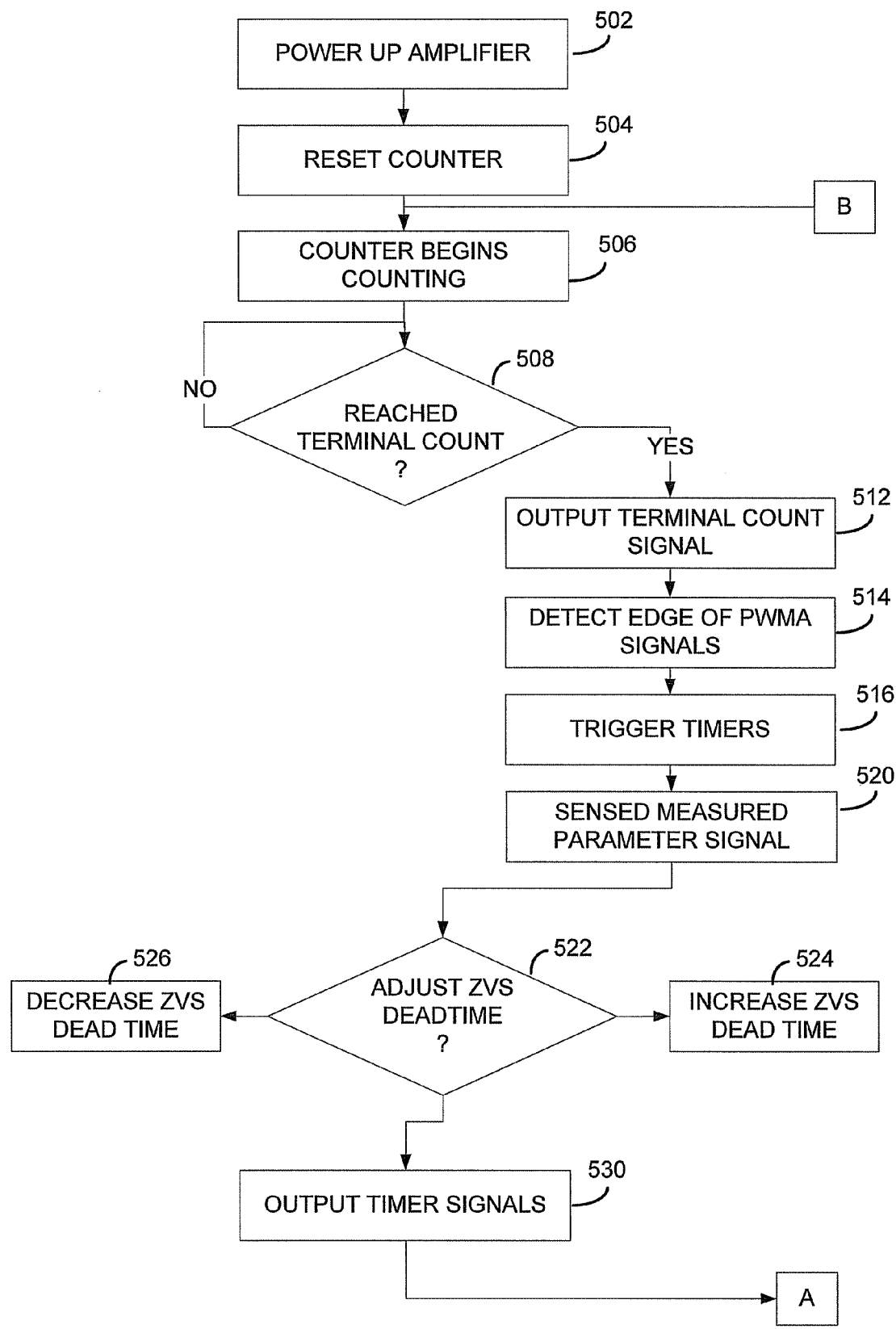
FIG. 5 is process flow diagram illustrating operation of the zero voltage switching mode controller of FIGS. 1-4.

FIG. 5 is a process flow diagram illustrating example operation of the automatic ZVS mode controller 204 discussed with reference to FIGS. 1-4. In other examples, the sequence and/or the number of steps can vary as previously discussed. At block 502, the audio amplifier 104 is powered up and receives an audio input signal from the audio source 102. The counter 326 is reset based on the power up at block 504. At block 506, the counter 326 begins counting PWM pulses of the PWMA signal 314. It is determined if the counter 326 has reached terminal count at block 508. If not, the operation continues checking to determine if terminal count has been reached. If at block 508 terminal count has been reached, the counter 326 outputs a TC signal to the ZVS enable 348 and 350 in the switching control signal output circuit 310 (FIG. 3) or the controller 308 (FIG. 4) at block 512. At block 514, the edge detectors 330 and 334 in the input processing circuit 302 detect an edge of the respective PWMA signal 314 and the PWMB signal 316.

A detected edge signal is provided as an input to trigger the first timer 340 and the second timer 342 at block 516. At block 520, a measured parameter signal indicative of the load current supplied by the audio amplifier 104 to the load 106 is sensed and provided to the controller 308 as a feedback signal. The controller 308 determines at block 522 if the variable ZVS dead-time applied to the PWMA signal 314 and the PWMB signal 316 with the second timer 342 should be adjusted to be longer (at block 524) or shorter (at block 526) depending on the magnitude of the load current. At block 530, the output pulses of the first and second timers 340 and 342 are provided to the switching control signal output circuit 310.

Figure 6:
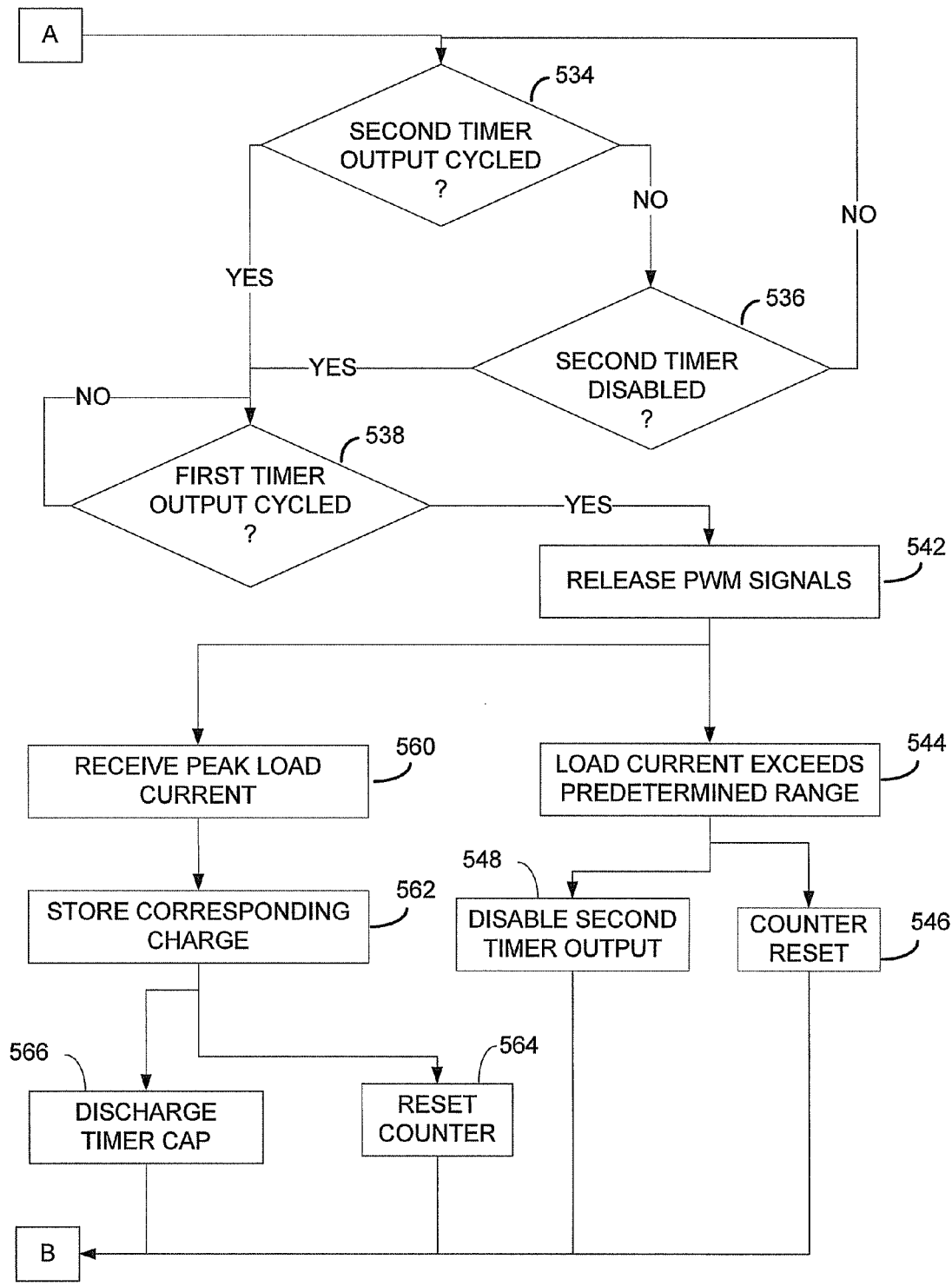
FIG. 6 is a second part of the process flow diagram of FIG. 5.

Referring now to FIG. 6, logic in the switching control signal output circuit 310 delays the PWMA signal 314 and the PWMB signal 316 from being output to the gate drivers 210 until the output pulses from the first timer 340 (temperature compensated fixed ZVS dead-time) and/or the second timer 342 (automatically variable ZVS dead-time) have completed cycling such as from a "logic one" state back to a "logic zero" state. Thus, at block 534 it is determined if the output pulse from the second timer 340 has cycled back to a resting state. If not, it is determined at block 536 whether the second timer 342 has been disabled with the ZVS enable 348 and 350 (FIG. 3). If the second timer 342 has not been disabled with the ZVS enable 348 and 350, the operation returns to block 534.

If the second timer 342 has cycled at block 534 or the second timer 342 is disabled at block 536, it is determined if the first timer 340 has cycled at block 538. If the first timer 340 has not cycled at block 538, the operation continues monitoring for the output pulse of the first timer 340 to cycle. If the first timer 340 has cycled, at block 542 the logic in the switching control signal output circuit 310 releases the PWMA signal 314 and the PWMB signal 316 to the respective gate drivers 210 with dead-time inserted therein.

As discussed with reference to FIG. 3, at block 544, the measured parameter signal is provided as a feedback signal that indicates that the signal induced load current has increased beyond the predetermined range of current flow to the load 106. The counter 326 in response to receipt of the clear signal (Clr) is reset at block 546. At the same time the counter 326 is reset, the ZVS enable 348 and 350 disable the variable ZVS dead-time output of the second timer 342 from being provided to the switching control signal output circuit 310 at block 548, and following the counter reset and disabling of the variable ZVS dead-time, the operation returns to block 506.

Alternatively, as discussed with reference to FIG. 4, at block 560 the controller 308 receives a measured parameter signal indicative of a magnitude of peak load current as a feedback signal. A corresponding magnitude of charge is stored on the timing capacitor 430 at block 562. At block 564, the counter 326 is reset. At the same time the counter 326 is reset, a slow discharge to ground of the stored charge on the timing capacitor 430 commences at block 566, and following the counter rest and commencement of discharge of the stored charge, the operation returns to block 506.

In the previously described examples, the automatic ZVS mode controller 208 may optimize ZVS dead-time during operating conditions in which ZVS is favorable and reduce the ZVS dead-time and/or disable ZVS mode completely when use of ZVS becomes less than optimal. With the automatic ZVS mode controller 208, ZVS dead-time delays may be rapidly removed from the audio amplifier 104 to optimize the robustness of the output switching stage at high load current levels, and ZVS dead-time may be dynamically modulated up to a maximum ZVS deadtime during quiescent operating conditions to maximize efficiency at relatively low load current levels. In addition, due to the capability to dynamically and automatically either disable ZVS mode or reduce the ZVS dead-time to a minimum level, linearity of the output load current may be maximized.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

I claim:

1. An automatic zero voltage switching mode controller comprising:
   a first timer operable at a first time interval;
   a second timer operable at a second time interval;
   a switching control signal output circuit configured to selectively drive a switching stage of a switch mode power converter with zero voltage switching in accordance with one of the first time interval and the second time interval;
   a controller coupled with the second timer, where the controller is configured to automatically adjust the second time interval of the second timer to adjust a zero voltage switching dead-time based on a measured parameter indicative of a predetermined range of alternating current flow to a load; and
   a counter configured to disable the second timer in response to the measured signal being indicative of a current flow to the load greater than a predetermined amount.

2. The automatic zero voltage switching mode controller of claim 1, where the controller is further configured to adjust the second time interval of the second timer to be less than the first time interval based on the measured signal being indicative of a current flow to the load greater than a predetermined amount.

3. The automatic zero voltage switching mode controller of claim 1, where the first time interval of the first timer is a fixed time interval set to maintain a minimum switch dead-time at all times.

4. The automatic zero voltage switching mode controller of claim 3, where the first timer is configured to automatically adjust the fixed time interval to compensate for changes in temperature of the switching stage.

5. The automatic zero voltage switching mode controller of claim 1, where the controller is configured to decrease the second time interval in response to the measured parameter being indicative of an increase in the current flow to the load.

6. The automatic zero voltage switching mode controller of claim 5, where the controller is configured to increase the second time interval in response to the measured parameter being indicative of a decrease in the current flow to the load.

7. The automatic zero voltage switching mode controller of claim 1, where the automatic zero voltage switching mode controller comprises an integrated circuit that includes the first timer, the second timer, and the switching control signal output circuit.

8. An automatic zero voltage switching mode controller comprising:
an input processing circuit configured to receive a pulse width modulation signal;
a timer circuit configured to selectively impose a zero voltage switching dead time having a variable time period on the pulse width modulation signal; and
a controller configured to receive a measured parameter indicative of a load current of a power converter, the controller coupled with the timer circuit and further configured to dynamically adjust the variable time period to a maximum time period in response to the load current being at quiescent conditions, and the controller further configured to progressively reduce the variable time period in accordance with increased load current,
where the input processing circuit is configured to disable the dynamically adjustable variable time period in response to the load current exceeding a predetermined magnitude.

9. The automatic zero voltage switching mode controller of claim 8, where the power converter is a half bridge, class D, DC to AC power converter.

10. The automatic zero voltage switching mode controller of claim 8, where the power converter is a full bridge, class D, DC to AC power converter.

11. The automatic zero voltage switching mode controller of claim 8, where the controller comprises a peak catch and hold detector configured to catch and hold the measured parameter indicative of the load current.

12. The automatic zero voltage switching mode controller of claim 11, where the input processing circuit comprises a counter configured to count the pulse width modulation signal, and the peak catch and hold detector comprises a timer capacitor configured to store a charge indicative of a current peak load current, the peak catch and hold detector configured to discharge the timer capacitor when the counter reaches a predetermined count.

13. The automatic zero voltage switching mode controller of claim 8, where the timer circuit comprises a first timer and a second timer, wherein the first timer is configured to provide a fixed time period representative of a minimum zero voltage switching dead time, and the second timer is configured to provide the variable time period, one of the variable time period and the fixed time period being the zero voltage switching dead time.

14. A method of controlling automatic zero voltage switching, the method comprising:
receiving a pulse width modulation signal;
sensing a measured parameter indicative of a load current of a power converter;
adjusting a variable zero voltage switching dead time in accordance with a magnitude of the load current;
inserting the variable zero voltage switching dead time into the pulse width modulation signal; and
disabling the variable zero voltage switching dead time when the load current exceeds a predetermined magnitude.

15. The method of claim 14, where inserting the variable zero voltage switching dead time comprises inserting the variable zero voltage switching dead time when the load current is within a predetermined range that includes quiescent operating conditions of the power converter.

16. The method of claim 14, where adjusting a variable zero voltage switching dead time comprises increasing a time period of the variable zero voltage switching dead time to a maximum time period when the load current is indicative of quiescent conditions of the power converter, and decreasing the variable zero voltage switching dead time when the load current is indicative of increasing load current.

17. The method of claim 14, where adjusting a variable zero voltage switching dead time comprises replacing the variable zero voltage switching dead time with a minimum zero voltage switching dead time when the load current exceeds a predetermined magnitude.

* * * * *